United States Patent
Zeng et al.

(10) Patent No.: US 10,662,550 B2
(45) Date of Patent: May 26, 2020

(54) DIAMOND NANOSTRUCTURES WITH LARGE SURFACE AREA AND METHOD OF PRODUCING THE SAME

(71) Applicant: Advanced Diamond Technologies, Inc., Romeoville, IL (US)

(72) Inventors: Hongjun Zeng, Naperville, IL (US); Nicolaie A. Moldovan, Plainfield, IL (US)

(73) Assignee: JOHN CRANE INC., Chicago, IL (US)

(*) Notice: Subject to any disclaimer, the term of this patent is extended or adjusted under 35 U.S.C. 154(b) by 0 days.

(21) Appl. No.: 15/801,759

(22) Filed: Nov. 2, 2017

(65) Prior Publication Data
US 2018/0119308 A1    May 3, 2018

Related U.S. Application Data

(60) Provisional application No. 62/417,006, filed on Nov. 3, 2016.

(51) Int. Cl.
*C30B 29/04* (2006.01)
*C01B 32/26* (2017.01)

(52) U.S. Cl.
CPC .............. *C30B 29/04* (2013.01); *C01B 32/26* (2017.08); *C01P 2002/30* (2013.01); *C01P 2006/12* (2013.01)

(58) Field of Classification Search
None
See application file for complete search history.

(56) References Cited

U.S. PATENT DOCUMENTS

| | | | |
|---|---|---|---|
| 4,766,040 A | 8/1988 | Hillert et al. |
| 5,955,155 A | 9/1999 | Yamamoto et al. |
| 6,447,843 B1 | 9/2002 | Olson |
| 6,592,839 B2 | 7/2003 | Gruen et al. |
| (Continued) | | | |

FOREIGN PATENT DOCUMENTS

| WO | WO 2012/142435 A2 | 10/2012 |
| WO | WO 2013/078004 A1 | 5/2013 |

OTHER PUBLICATIONS

Fujishima et al.; Electrochemical of Highly Conductive Boron-Doped Diamond Electrodes for Oxygen Reduction in Acid Solution; Journal of the Electrochemical Society; 146(3), 1081-1087; 1999.*

(Continued)

*Primary Examiner* — Guinever S Gregorio
(74) *Attorney, Agent, or Firm* — Cantor Colburn LLP

(57) ABSTRACT

A method for forming diamond nanostructures with large specific area can include forming porous diamond nanostructures by means of selectively etching $sp^2$-bonded carbon and partially removing $sp^3$-bonded carbon in nanocrystalline diamond (NCD) and ultrananocrystalline diamond (UNCD®) diamond). The diamond nanostructures achieved from the disclosed method can include a long shaft surrounded by a school of barbs. The nanostructure can provide a significantly larger surface area than diamond without such a nanostructure and its fabrication provides relative ease of manufacture compared to traditional techniques.

23 Claims, 11 Drawing Sheets

(56) References Cited

U.S. PATENT DOCUMENTS

| | | | |
|---|---|---|---|
| 6,620,210 | B2 | 9/2003 | Murphy et al. |
| 7,384,693 | B2 | 6/2008 | Ravi |
| 7,556,982 | B2 | 7/2009 | Carlisle et al. |
| 7,563,346 | B2 | 7/2009 | Chen |
| 8,101,273 | B2 | 1/2012 | Jacquet et al. |
| 8,734,626 | B2 | 5/2014 | Arihara et al. |
| 8,980,079 | B2 | 3/2015 | Yost, III et al. |
| 2008/0160271 | A1 | 7/2008 | Rueffer et al. |
| 2009/0017258 | A1 | 1/2009 | Carlisle et al. |
| 2010/0129615 | A1 | 5/2010 | Chizik et al. |
| 2011/0247929 | A1 | 10/2011 | Nagai et al. |
| 2012/0168302 | A1 | 7/2012 | Kato et al. |
| 2013/0213823 | A1 | 8/2013 | Arumugam et al. |
| 2013/0330529 | A1 | 12/2013 | Sato et al. |
| 2014/0174942 | A1 | 6/2014 | Wylie et al. |
| 2015/0376804 | A1* | 12/2015 | Gorokhovsky ....... C23C 14/024 204/290.12 |

OTHER PUBLICATIONS

Swain et al.; The Formation and Electrochemical Activity of Microporous Diamond Thin film Electrodes in Concentrated KOH; J. Electrochem. Soc.; vol. 144, No. 3; Mar. 1997.*

Einaga et al.; A Study on Electrolytic Corrosion of Boron-Doped Diamond Electrodes when Decomposing Organic Compounds; ACSAMI; p. 28299-28305; Mar. 2, 2016.*

J.V. Macpherson, "A practical guide to using boron doped diamond in electrochemical research," Phys. Chem. Chem. Phys., 17, pp. 2935-2949 (2014).

M. Panizza et al., "Electrochemical Polishing of Boron-Doped Diamond in Organic Media," Electrochemical and Solid-State Letters, 6(12), pp. D17-D19 (2003).

L.M. da Silva et al., "Boron Doped Ultrananocrystalline Diamond Films on Porous Silicon: Morphological, Structural and Electrochemical Characterizations," Materials Research, 18(6), pp. 1407-1413.

P. J. Pauzauskie et al., "Synthesis and characterization of a nonocrystalline diamond aerogel," PNAS, 108(21) pp. 8550-8553 (May 24, 2011).

V. Baranauskas et al., "Method of porous diamond deposition on porous silicon," Applied Surface Science, 185, pp. 108-113 (2001).

T. Kondo et al., "Micrometer-sized mesoporous diamond spherical particles," Diamond & Related Materials, 43, pp. 72-79 (2014.

F. Gao et al., "Highly porous diamond foam as a thin-film micro-supercapacitor material," Carbon, 80, pp. 833-840 (2014).

C. Hébert et al., "Porous diamond with high electrochemical performance," Carbon, 90, pp. 102-109 (2015).

H. Zanin et al., "Porous Boron-Doped Diamond/Carbon Nanotube Electrodes," ACS Applied Materials & Interfaces, 6, pp. 990-995 (2014).

* cited by examiner

DIAMOND NANOSTRUCTURES WITH LARGE SURFACE AREA AND METHOD OF PRODUCING THE SAME

CROSS-REFERENCE TO RELATED APPLICATION

This application claims benefit of priority to U.S. Provisional Patent Application No. 62/417,006, filed Nov. 3, 2016, which is incorporated by reference herein in its entirety.

STATEMENT REGARDING FEDERALLY SPONSORED RESEARCH OR DEVELOPMENT

This invention was made with government support under contract DE-SC0011265 awarded by the Department of Energy. The government has certain rights in the invention.

BACKGROUND OF THE INVENTION

1. Field of the Invention

The present disclosure relates to diamond nanostructures, and more particularly to diamond nanostructures with large surface area and methods for forming the same.

2. Description of Related Art

Doped diamond is a near ideal electrode material. It exhibits high therinal, chemical, mechanical and electrochemical stability, is compatible with multiple dopant options, its surface can be easily modified with various functional groups to enhance pseudocapacitance, it can readily accommodate a wide variety of electrolytes and exhibits the widest electrochemical ential window of any conductive material. Devices made of diamond, including supercapacitors, sensors, electrodes, medical devices, and the like, have been reported to provide performance and lifetime that other carbon materials such as reticulated vitreous carbon cannot. The larger the surface area, more particularly the larger the specific surface area, i.e., the total surface area of diamond per unit of mass, the higher can be the current efficiency, reaction rate, power density, detecting sensitivity, and biocompatibility of these devices. Therefore there have been ongoing efforts since the 1990s to increase surface area for diamond devices.

Manufacturing porous diamond with a large surface area has two basic technical categories, i.e., top-down and bottom-up methods. In top-down methods, a pre-established diamond surface is partially etched away, leaving nanostructure patterns behind. These methods usually require a mask to define the nanostructure, but some efforts do not have a mask. Potential mask materials include Al, Au, Ni, $Al_2O_3$, $SiO_2$, nitride, polymers or diamond particles. Etching technology options include chemical, thermal, and reactive ion etching, sputtering, ion beam etching and others. In the bottom-up methods, diamond is conformally coated on a nanostructure template of another material, such as carbon nanotubes, nanowires, nanoparticles, nanospheres, or the like. The template materials can be Si, metals, oxides, ceramics, carbides, or the like. Diamond can be directly grown into a nanostructure such as nanorods without a template, under certain critical conditions.

There are a few major challenges that prevent industries from widely using diamond nanostructures based on the techniques developed above. These challenges include scalability, prohibitive cost of nanofabrication techniques such as electron beam lithography to define nanomasks and nano-templates, and limited access to mask and template materials. Mask and template materials integrated with diamond are limited by critical diamond deposition criteria and diamond's specific properties, e.g., diamond deposition temperature usually higher than 600° C. and very low adhesion between diamond and many materials. Therefore even after about 30 years of research, efforts to make diamond nanostructures with large surface area, low cost, with high reliability, and ease of mass production still continues.

The conventional techniques have been considered satisfactory for their intended purpose. However, there is an ever present need for improved techniques for producing even larger surface area diamond nanostructures and lower fabrication cost. This disclosure provides a solution for this need.

SUMMARY OF THE INVENTION

A method of fabricating a diamond nanostructure includes providing a substrate. The method includes depositing a layer of polycrystalline diamond on to the substrate. The polycrystalline diamond has a small diamond grain size wherein a large number of grain boundaries include $sp^2$ carbon among grains that include $sp^3$ carbon. The method includes selectively removing $sp^2$ carbon and partially removing $sp^3$ from the layer of polycrystalline diamond, thereby increasing surface area of the layer of polycrystalline diamond, wherein the surface of the layer of polycrystalline diamond is made porous.

The layer of polycrystalline diamond can be a conductive layer of at least one of boron doped nanocrystalline diamond (BD-NCD) or boron doped ultrananocrystalline diamond (BD-UNCD® diamond). The layer of polycrystalline diamond can be conductive and can be doped with dopants other than boron, including at least one of nitrogen and/or phosphorus. The layer of polycrystalline diamond can have an average grain size of 50 nm or smaller characterized by scanning electron microscopy, atomic force microscopy, scanning transmission microscopy, and the like. The layer of polycrystalline diamond can have an average grain size of 100 nm or smaller. The layer of polycrystalline diamond can have an average grain size of 20 nm or smaller.

The $sp^2$ carbon can be selectively removed and the $sp^3$ carbon can be partially removed by an organic acid. The organic acid can contain acetic acid or oxalic acid. Selectively removing $sp^2$ carbon can include selectively removing carbon by application of a positive voltage on the layer of polycrystalline diamond, whereby at least a portion of the carbon is etched off. An inorganic electrolyte can be used separately or combined with the organic acid for removing $sp^2$ and $sp^3$ carbon. The inorganic electrolyte can include NaCl or Sulfuric acid. Application of a positive voltage can include applying a current density of 400-2500 $mA/cm^2$ at 10-30 V to a cell including the organic acid as electrolyte and the layer of polycrystalline diamond as anode. Partially removing $sp^3$ carbon can include removing at least one whole diamond grain in the layer of polycrystalline diamond. Partially removing $sp^3$ carbon can include partially removing mass from at least one facet of at least one diamond grain in the layer of polycrystalline diamond.

The substrate can include at least one of Si, Mo, Nb, Ta, Ti, W, conductive ceramics, and/or conductive carbides. The method can include adjusting $sp^2/sp^3$ ratio of the layer of polycrystalline diamond for ease of etching. The method can include adjusting facet orientation in the layer of polycrystalline diamond for ease of etching.

The $sp^2$ carbon can be selectively removed and the $sp^3$ carbon can be partially removed with one or more selective and/or preferential etching process including thermal oxidation, hot gas corrosion, reactive ion etching, plasma etching, laser ablation, ion beam etching and the like, and/or a combination of these methods, wherein a substantial portion of diamond material remains. The method can include ceasing selective removal of $sp^2$ carbon and partial removal of $sp^3$ carbon once the layer of polycrystalline diamond is formed into a layer of feather-like diamond (FLD) nanostructures and before any substantial number of the FLD nanostructures are removed. Ceasing removal of carbon can be performed at a point during selective removal of $sp^2$ carbon and partial removal of $sp^3$ carbon when surface area of the layer of polycrystalline diamond has increased to at least two times that of the layer of polycrystalline diamond prior to selective removal of $sp^2$ carbon.

The method can include after selective removal of $sp^2$ carbon and partial removal of $sp^3$ carbon from the layer of polycrystalline diamond, forming at least one of a capacitor, a supercapacitor, or a sensor electrode using the layer of polycrystalline diamond.

A diamond nanostructure electrode can be formed by a process as described above, wherein the diamond nanostructure electrode includes a layer of FLD nanostructures. A free standing diamond nanostructure can be formed by a process as described above, including a layer of feather-like diamond nanostructures after removing the substrate.

A feather-like diamond (FLD) nanostructure produced by a method as described above includes at least one shaft. At least one barb is attached to the shaft. The at least one barb extends from the shaft.

Both the at least one shaft and the at least one barb can be $sp^3$ diamond with a purity of 90% or more. The shaft can have a lateral size range of 5-100 nm and a length comparable to thickness of the layer of polycrystalline diamond before selective removal of $sp^2$ carbon. The barbs can have an average width and thickness range of 5-30 nm, and an average length range of 5-200 nm. Pores can be present in the layer of polycrystalline diamond after removal of carbon due to removal of $sp^2$ and mass loss of $sp^3$ in spaces between barbs and between FLD nanostructures. Pores between barbs and FLD nanostructures can lead to an enlarged surface area at least 2 times larger than the planar area of the layer of polycrystalline diamond before the disclosed nanostructure is formed.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
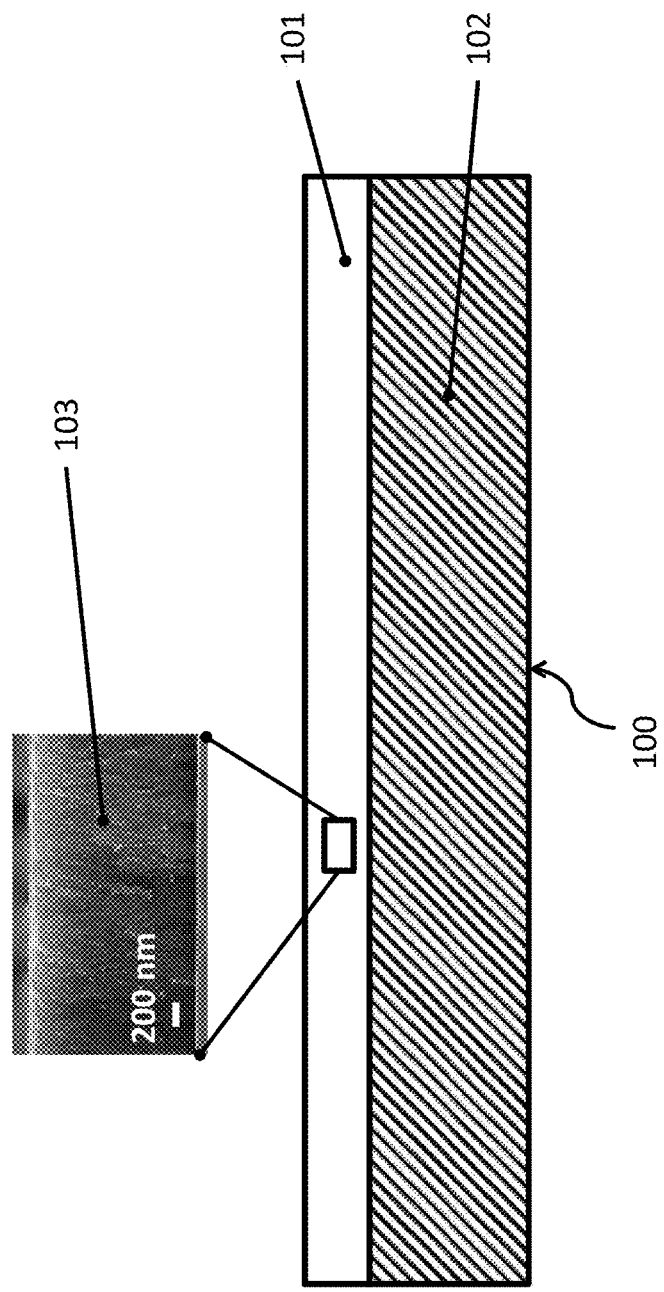
FIG. 1 is a schematic view of a sample to be fabricated into feather-like diamond (FLD) nanostructure in accordance with the present disclosure.

Reference will now be made to the drawings wherein like reference numerals identify similar structural features or aspects of the subject disclosure. For purposes of explanation and illustration, and not limitation, a partial view of an exemplary embodiment of a nanostructure in accordance with the disclosure is shown in FIG. 3 and is designated generally by reference character 301. Other embodiments of nanostructures in accordance with the disclosure, or aspects thereof, are provided in FIGS. 1-2D and 4-10, as will be described. The systems and methods described herein can be used to produce diamond nanostructures with substantially increased surface area and greater ease of manufacture compared to traditional techniques.

Electrochemical methods to manufacture a unique feather-like diamond nanostructure as disclosed herein lead to large surface area. The disclosed methods do not require use of expensive facilities and complicated processes employed in the traditional techniques mentioned above.

Synthetic polycrystalline diamond made by chemical vapor deposition (CVD) can be categorized into microcrystalline diamond (MCD), nanocrystalline diamond (NCD) and ultrananocrystalline diamond (UNCD® diamond, available from Advanced Diamond Technologies, Inc. of Romeoville, Ill.) per their grain size. Among the grains of these polycrystalline diamonds, there are grain boundaries that contain $sp^2$-bonded disordered carbon. The smaller the grain size, the higher is the density of the grain boundaries. Note that $sp^2$ hybrid bonds in grain boundaries are less chemically stable than the $sp^3$ bonds in the diamond lattices of the neighboring grains. In accordance with this disclosure, one can preferentially etch off the $sp^2$-bonded carbon atoms from grain boundaries and part of the small grains, and leave a large number of tiny voids which expose a large surface area of the diamond structure that survives the etching process.

Although such an etch can be realized by any suitable etching process, including thermal oxidation, laser ablation, hot gas corrosion, reactive ion etching, plasma etching in oxygen enriched environment, laser ablation, ion beam etching, or the like, the embodiments of disclosed methods use electrochemical etching to fabricate the nanodiamond structure. In the electrochemical etching process, doped conductive NCD or UNCD® diamond is provided at an anode position of an electrochemical cell. Under high enough current density through the electrochemical circuit, the $sp^2$ bonds in the grain boundaries are etched first, with a faster etching rate than the rate of etching $sp^3$ bonds. Although the etch rate of $sp^2$ bonds is higher than that of $sp^3$ bonds, partially removing $sp^3$ bonds may also contribute to forming the nanostructures. Removing $sp^3$-bonded carbon atoms can be achieved by two processes: 1) etching fast facets of the diamond grains (which have a relatively high etching rate due to the orientation of the crystal structure exposed to the etchant) and to a lesser extent etching the slow facets (that have a slower etching rate than the fast facets due to having an exposed crystal structure orientation that is more resistant to the etchant) and/or 2) removing whole grains when grain boundaries around them are etched through.

This application discloses a feather-like diamond (FLD) nanostructure made from boron doped NCD or UNCD® diamond, after applying the disclosed anodic etching process mentioned above. The FLD nanostructure has a similar structure to a bird feather including a shaft and many barbs. The shaft of the diamond structure has a length comparable to the thickness of the NCD or UNCD® diamond film, on the order of microns, and a width and thickness of 5-100 nm. The shaft keeps almost same width and thickness from the bottom to the top of the UNCD® film. The shaft supports barbs that are 5-30 nm wide and thick and up to 200 nm long, e.g., the barb length can be 50-200 nm. One shaft and the barbs extending from this shaft form a single FLD nanostructure. When anodic etching is conducted, $sp^2$ bonded carbon in the boundaries between the nanofeathers and their barbs is etched away, followed by mass loss of diamond, a large surface area in these etched spaces is exposed to the electrochemical environment.

FIG. 1 shows the diamond anode 100. The anode 100 made by boron doped nanocrystalline diamond (BD-NCD) or ultrananocrystalline diamond (BD-UNCD®) film 101 deposited on a substrate 102. The substrate 102 supporting the diamond film 101 can for example be Si, $SiO_2$, nitride, ceramics, carbides, Nb, Mo, Ta, Ti, W, or the like. The substrate 102 can also include carbon materials such as graphite, carbon foams, reticulated vitreous carbon (VRC), or the like. The substrate 102 can be 2-dimentional or 3-dimentional. The substrate 102 can be intrinsically porous to pre-establish a large initial surface area for the diamond film 101. The deposited diamond film 101 has a thickness of 100 nm-50 μm. The diamond needs to be thick enough to prevent pin-holes and hence the chemical attack on the exposed substrate. Diamond 101 has a resistivity of 0.002 ohm•cm-10 ohm•cm. The as-deposited, doped NCD and UNCD® diamond have a very small, condensed grain and grain boundary distribution. The layer of polycrystalline diamond can have an average grain size of 3-100 nm, characterized by scanning electron microscope, atomic force microscope, scanning transmission microscope, and the like. For example, the average grain size can be 50 nm or smaller. An example of a cross-sectional SEM image of the as deposited BD-UNCD® diamond film 101 is shown in FIG. 1 as 103. In some embodiments, the diamond film can also be doped by one or more other dopants such as boron, nitrogen, phosphorus, or the like.

Figure 2A:
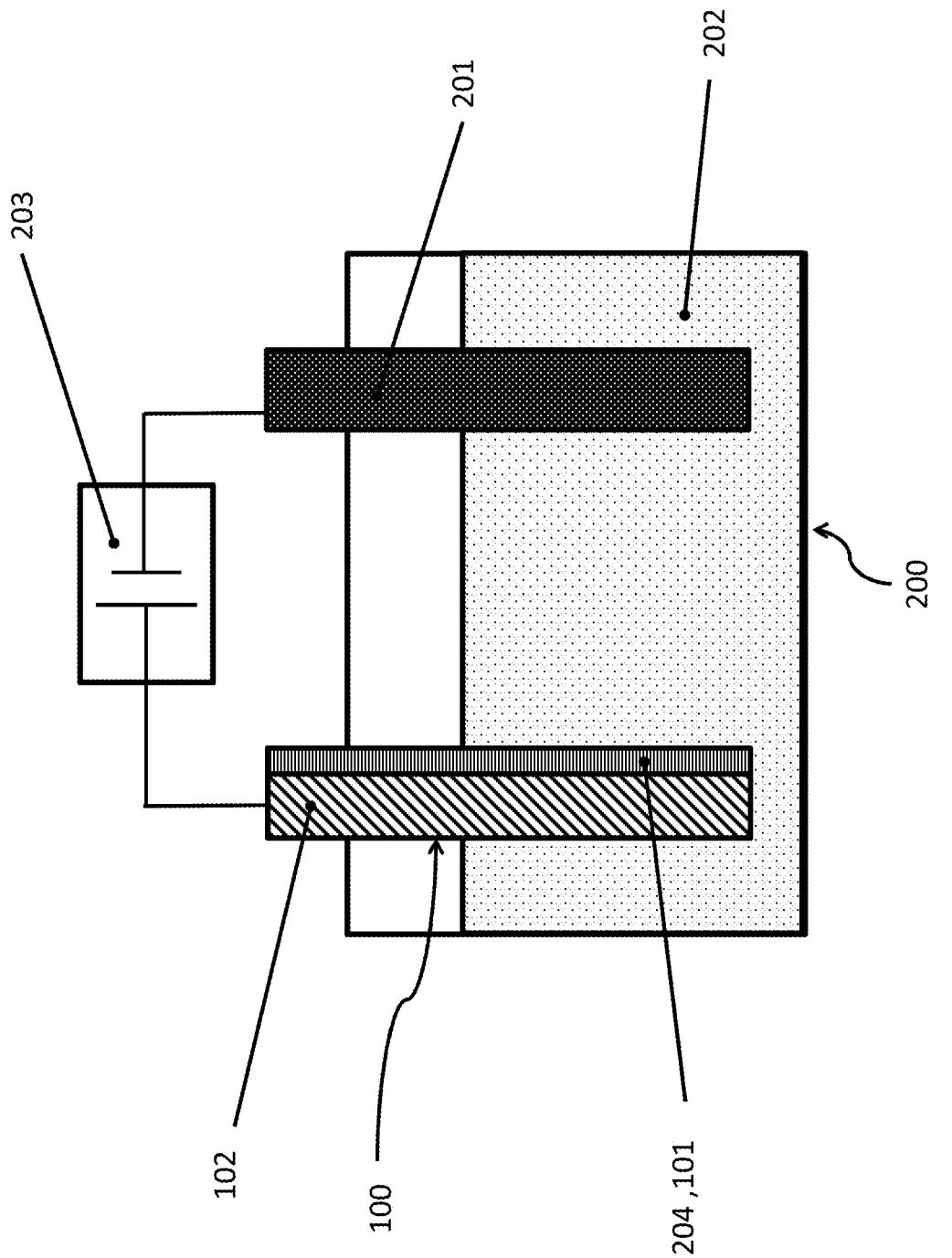
FIG. 2A is a schematic view of an electrochemical etching apparatus to produce FLD nanostructure constructed in accordance with an exemplary embodiment of the present disclosure.
Figure 3:
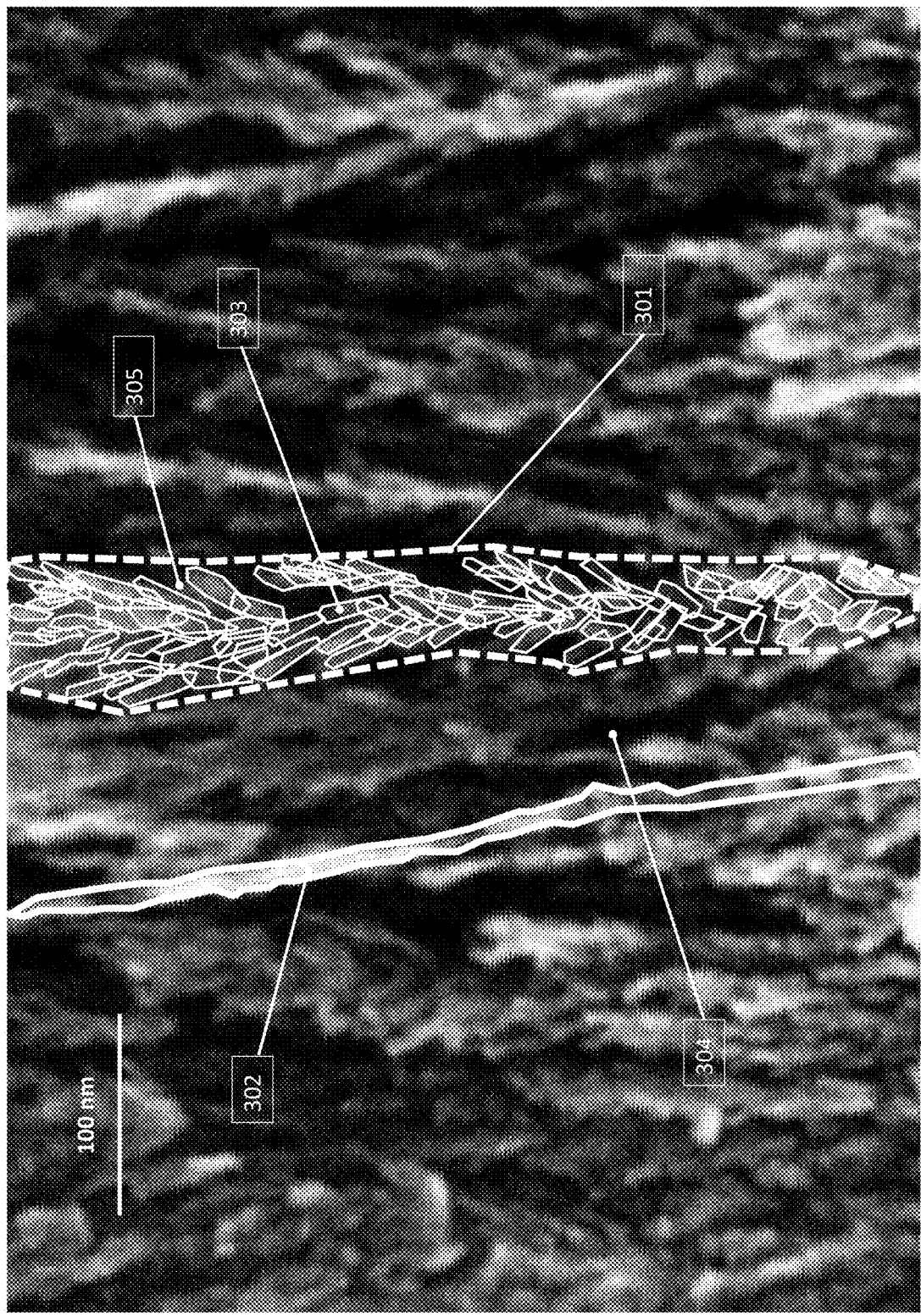
FIG. 3 is a cross-section view that schematically shows a feather-like diamond nanostructure in a scanning electron microscope (SEM) image of a manufactured diamond film in accordance with an embodiment of the present disclosure.

FIG. 2A shows an electrochemical apparatus 200 to produce the FLD nanostructure. The diamond coated electrode, anode 100, is installed on the anode position. Cathode 201 can include conductive materials such as metals, Si and/or conductive diamond similar to the diamond material of anode 100. Anode 100 and cathode 201 are partially soaked in an electrochemical solution 202. This technique includes applying a high positive voltage from a power supply 203 to oxidize the carbon material in an aqueous electrolyte. The electrochemical solution 202 may include an organic acid. It is also contemplated that an acid electrolyte can be used instead of an electrochemical solution. Examples of organic acids that may be used for the etching include acetic or oxalic acid. An inorganic electrolyte can be used separately or combined with the organic acid for removing $sp^2$ and $sp^3$ carbon. The inorganic electrolyte can include NaCl or Sulfuric acid. Those skilled in the art having the benefit of this disclosure will readily appreciate that any corrosive media, capable of showing a differential etching or selectivity between $sp^2$ and $sp^3$-bonded carbon in the polycrystalline diamond can be used, with higher porosity reached with higher selectivity.

The diamond film 101 faces cathode 201. Both anode 100 and cathode 201 are electrically connected to the power supply 203. The power supply 203 provides a current with a current density in a range of 0.05-5 A/$cm^2$. With the electrical current applied, anode oxidation happens on the diamond anode 100 and causes an electrochemical etch in the diamond layer of film 101. First the etching removes less stable $sp^2$ carbon from the grain boundaries of the diamond film 101, then it removes a certain amount of $sp^3$ carbon from the fast facets, and/or removes whole grains when the grain boundaries around these grains are etched through. As the anodic etching propagates into the diamond film 101, deeper and deeper porous structures are formed until electrochemical solution 202 reaches the interface of diamond film 101 and substrate 102 shown in FIG. 1. If the anodic etching process is stopped at or before a point when the electrochemical solution 202 reaches the interface of diamond film 101 and substrate 102, the feather-like diamond nanostructure layer 204 (what remains of the original diamond film 101) integrated on the substrate 102 is achieved. If the anodic etching process is stopped after the electrochemical solution 202 reaches the interface of diamond film 101 and substrate 102, a lateral etching process (undercut) can remove the FLD nanostructure layer 204 from the substrate 102.

Figure 2D:
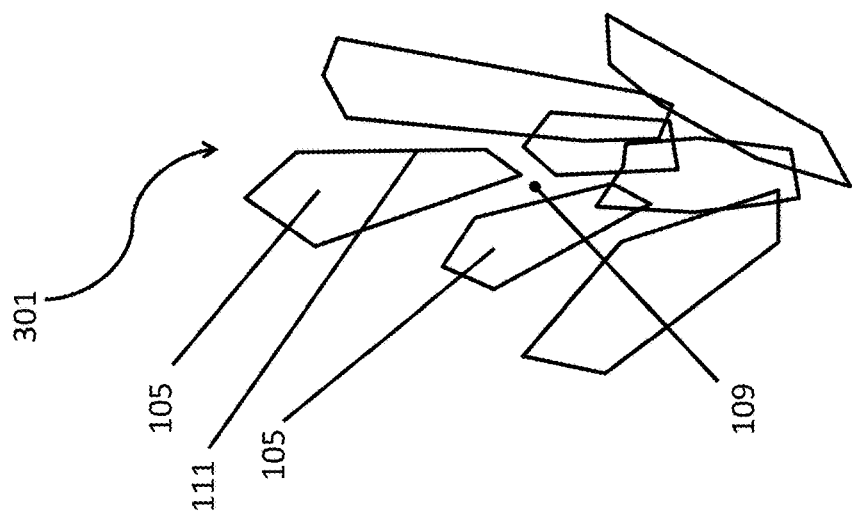
FIG. 2D is a schematic view of grains during production of the FLD nanostructure of FIG. 2C, schematically showing open space formed between grains after etching.
Figure 2C:
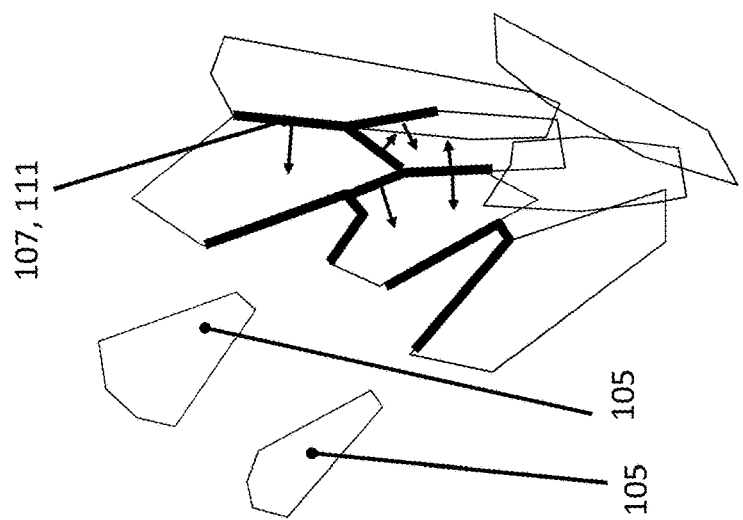
FIG. 2C is a schematic view of grains during production of the FLD nanostructure of FIG. 2B, schematically showing grains detached from the diamond layer and schematically showing removal of $sp^3$ carbon from facets of grains.
Figure 2B:
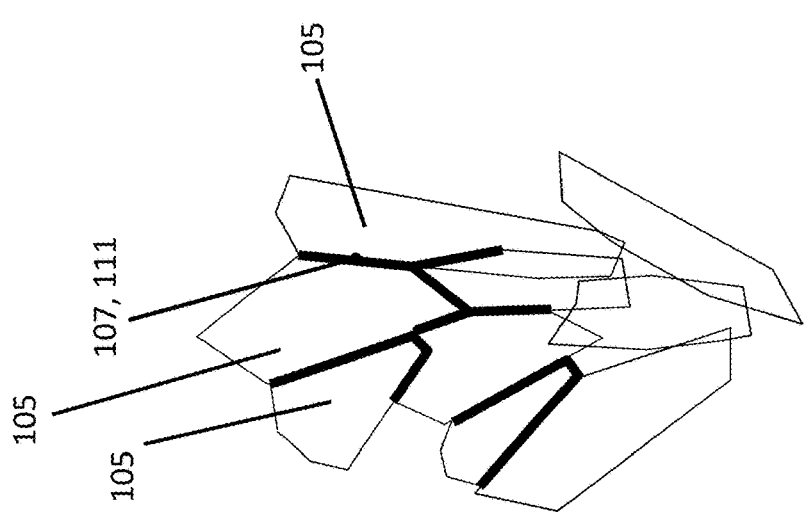
FIG. 2B is a schematic view of grains in a diamond layer during production of FLD nanostructure in accordance with the present disclosure, schematically indicating removal of $sp^2$ carbon from grain boundaries.

FIGS. 2B-2D schematically show the removal of $sp^2$- and $sp^3$-bonded carbon in the scale of grains. FIG. 2B shows a group of several diamond grains 105 attached to each other before the etching process describe above. For sake of clarity, not all of the grains 105 are identified with a reference character in FIGS. 2B-2D. When electrochemically exposed to the etching environment, $sp^2$ carbon is removed from the grain boundaries 107 as indicated by the heavy lines in FIG. 2B. When the grain boundaries 107 around a grain 105 are etched through, the grain 105 may detached from the grain group as indicated by the loose grains 105 identified in FIG. 2C. Electrochemical solution may penetrate into the etched grain boundaries 107, leading to etching certain facets 111 of grains along the directions indicated by the small arrows pointing away from the heavy lines in FIG. 2C. Eventually, the etched grain boundaries 107 and detached grains 105 leave the remaining grains 105 in the original diamond layer and the partially etched grains 105 surrounded by small spaces 109 left by the removed carbon. The remaining grains 105 are attached to the shaft 302 (not shown in FIG. 2B-2D for sake of clarity but see FIG. 3), thus forming the feather-like diamond nanostructure 301 with enlarged surface area.

FIG. 3 shows an cross-sectional SEM image with a schematic overlay showing one unit of typical FLD nanostructure based on the diamond film 101 processed by the method described above into FLD nanostructure layer 204. The FLD nanostructure 301 highlighted by dash lines includes a shaft 302 (one of which is outlined to the left in FIG. 3 for sake of clarity) and a group of barbs 303 extending from the shaft 302. This shaft and barb structure gives rise to the simple feather analogy used herein for the disclosed diamond nanostructure. Bird feathers are usually planar, i.e., the barbs of the bird feathers almost generally grow from a shaft in one plane. However for the FLD nanostructure 301, the barbs 303 can connect with and surround the shaft 302 in a 3-dimentional space, therefore, if one FLD nanostructure 301 is shown under SEM with most of its barbs 303, the shaft 302 is usually covered from view by the barbs 303. When the process film 101 is over etched or cleaved for SEM, some barbs are chopped off and the shaft 302 can be seen, as shown on the left in FIG. 3 and FIG. 5. The shaft 302 has a potential length on the order of micrometers, and a width and thickness of 5-100 nm, giving an aspect ratio up to 100:1 or even higher. The shaft width remains almost constant from the bottom to the top of the UNCD® film 101. The shaft 302 supports barbs 303 that are potentially 5-30 nm wide and thick, and up to 200 nm long, thus a unit of the FLD nanostructure 301 has a width up to 200 nm and a length of a few microns. Compared to the dense and solid grain arrangement in the as-deposited diamond 103 (shown in FIG. 1), spaces 304 between the FLD nanostructures and the spaces 305 between the barbs 303 in a given FLD nanostructure 301 are clear after the etching process. This provides a large specific surface area of the whole FLD nanostructure layer 204 that remains of diamond film 101. At the same time, the barbs 303 from different FLD nanostructures 301 support each other, which prevents the FLD nanostructures 301 from collapsing or detaching each other.

The spatial profile in the nanometer scale of the diamond layer 204 and the pore size (between the FLD nanostructures 301 and between the barbs 303 in a given FLD nanostructure 301), can be controlled by: diamond grain feature, composition of the electrochemical solution 202 (shown in FIG. 2A), electrical current density, distance between anode and cathode in apparatus 200 (shown in FIG. 2A), temperature on the electrode surface, and etching time.

An important aspect of producing an FLD nanostructure layer 204 is to effectively remove $sp^2$ carbon from grain boundaries and some mass from diamond grains, without damaging the frame of FLD nanostructures 301, i.e., the shafts 302 and the barbs 303. The electrochemical method above can meet this goal. In some embodiments, other etching/oxidizing methods may be used to remove $sp^2$ carbon and diamond. These methods include but are not limited to chemical etching, thermal decomposition, laser ablation, ion sputtering, plasma etching, reactive ion etching, or any suitable combination of these removing techniques. In general, the higher the differential etching achieved by the etching method between $sp^2$- and $sp^3$-bonded carbon, the longer and better delineated become the shaft and barbs. Combinations of methods with high differential etching followed by one or several with lower differential etching can be used to leverage between longer shafts and barbs with somewhat larger average cross sections, and shorter shafts and barbs with finer average cross section.

In some embodiments, one can observe the FLD nanostructure layer 204 includes not only a shaft-barb hierarchy, but a more complicated shaft-barb-barbule hierarchy, where diamond parts smaller than barbs 303, referred to herein as barbules, are connected and surround barbs 303. In some embodiments, one can control $sp^2/sp^3$ ratio in the diamond by changing operation parameters, including but not limited to gas ratio, reactor pressure, deposition temperature, and the like, so that a fast FLD and precise nanostructure fabrication can be achieved. In a case where at least w/w 90% percent of the original diamond film 101 is $sp^3$ grains and up to w/w 10% is $sp^2$ at the grain boundaries, a final FLD nanostructure layer 204 can be at or nearly w/w 100% $sp^3$ diamond after the removal of $sp^2$ carbon. In some embodiments, one can control facet orientation during the diamond deposition by changing operational parameters such as adding morphology-controlling gases or employing bias enhancing nucleation techniques during the diamond deposition, so that the faster facets, e.g., as shown in FIGS. 2B-2D, can be exposed to the etching environment and so that fast FLD nanostructure fabrication may be achieved. Etching time in accordance with embodiments of this disclosure is proportional to film thickness instead of film area as was the case with traditional techniques. Thus the present disclosure offers a technique that can be scaled up for area without necessarily adding to the process time. A free standing diamond nanostructure can be formed by a process as described above, including a layer of feather-like diamond nanostructures after removing the substrate.

A combination of the discussed methods may be utilized to optimize the process of producing the desired surface area and porosity on an application by application basis. The following examples are provided to show exemplary embodiments and those skilled in the art having the benefit of this disclosure will readily appreciate that other variations of the systems, techniques, and nanostructures disclosed herein are possible without departing from the scope of this disclosure.

Example 1

Figure 4:
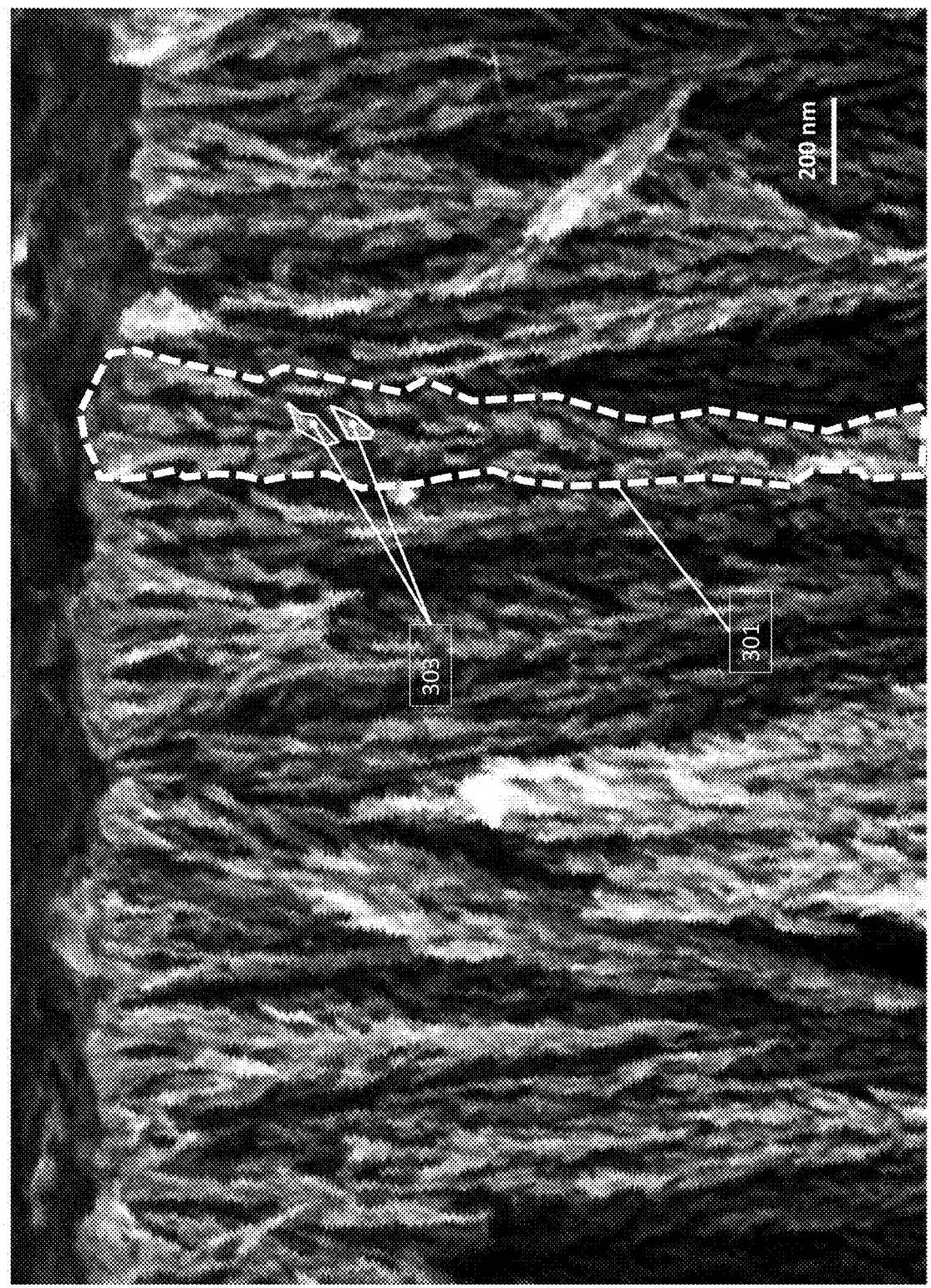
FIG. 4 is a cross-sectional SEM image of an exemplary embodiment of FLD nanostructure, showing the sample from Example 1, with a number of typical FLD nanostructures.
Figure 5:
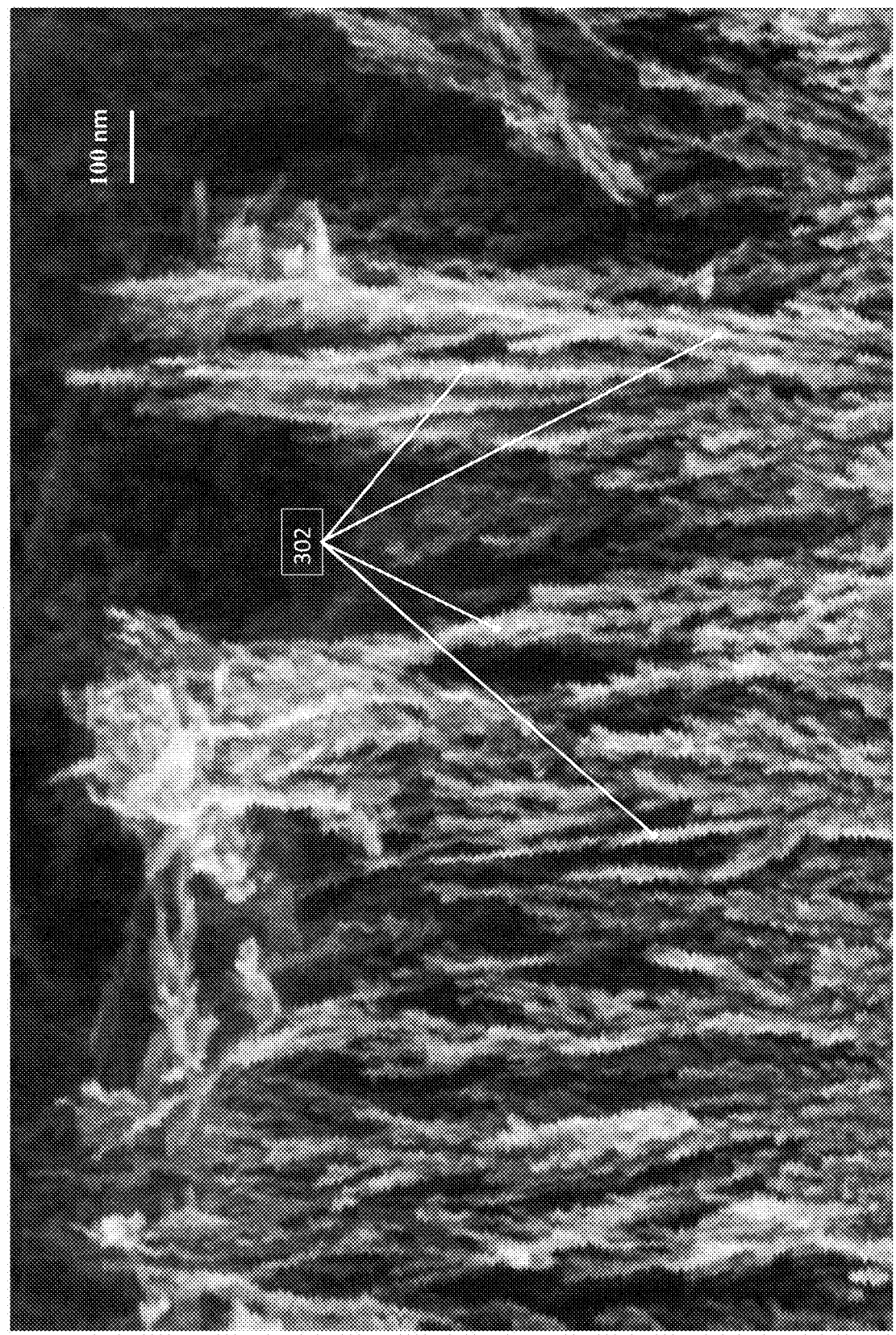
FIG. 5 is a cross-sectional SEM image of the sample from Example 1, with a number of exposed shafts of FLD nanostructures.
Figure 6:
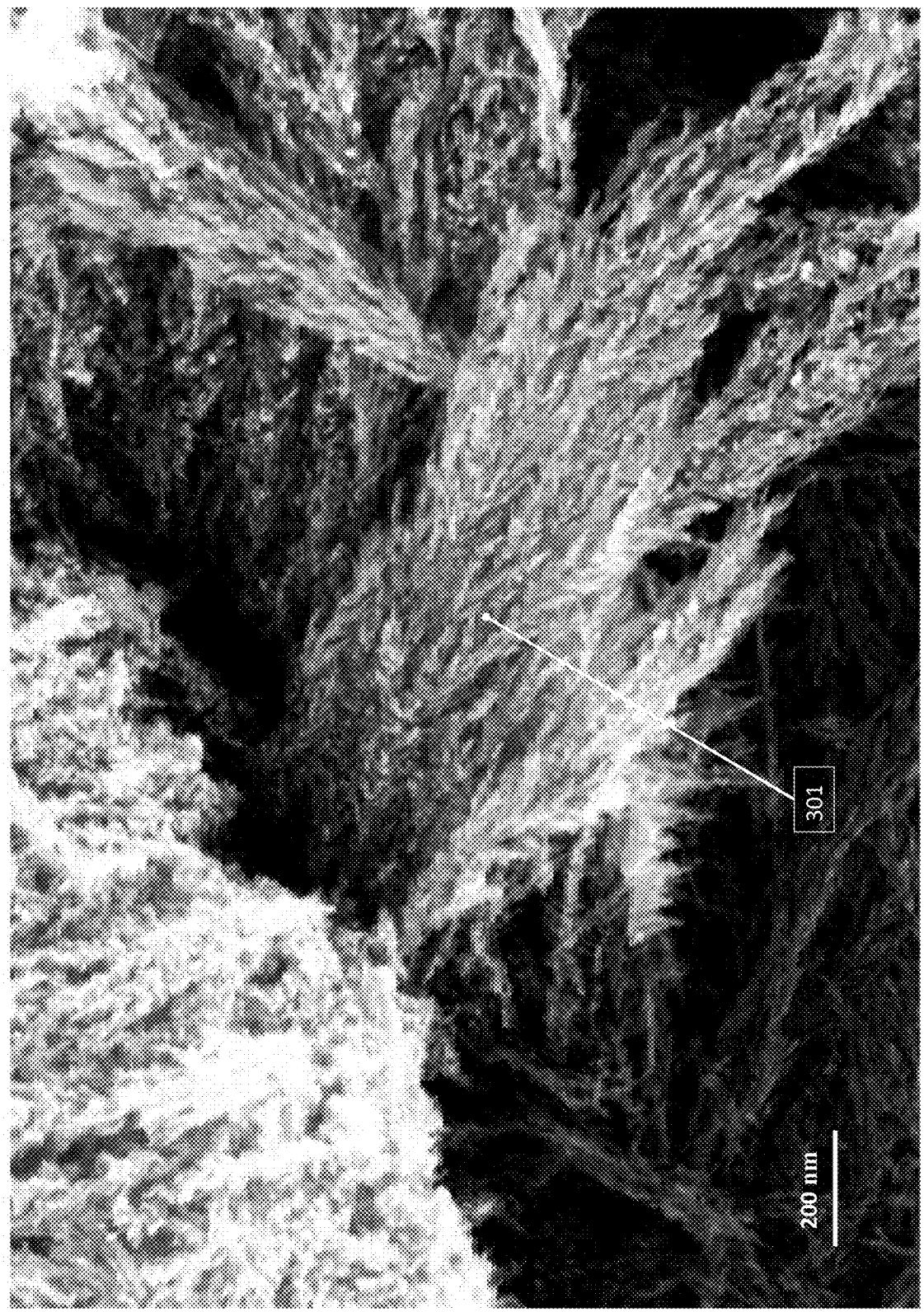
FIG. 6 is an SEM image of the sample from Example 1, with a number of falling FLD nanostructures.
Figure 7:
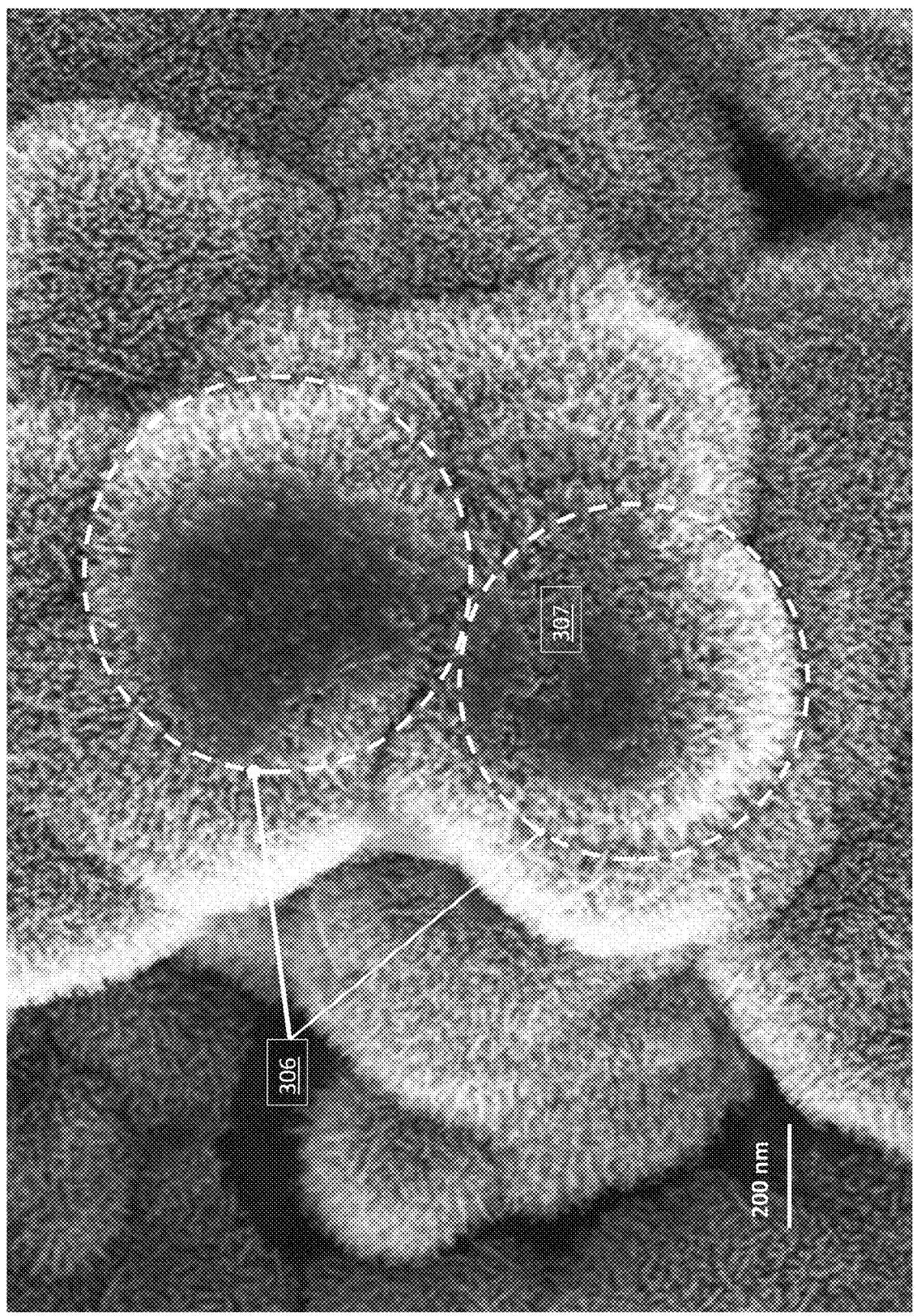
FIG. 7 is a top view SEM image of FLD nanostructures from Example 2.

Boron doped UNCD® (BD-UNCD®) diamond is synthetized on silicon wafer slides by using a hot filament chemical vapor deposition (CVD) system. The BD-UNCD® diamond has a grain size of 5-15 nm, a thickness of 2 μm and a resistivity of 0.08 ohm•cm. A solution of 3M acetic acid and 1M sulfuric acid is introduced into an electrochemical cell with two BD-UNCD® wafers slides, one slide for the anode and another slide for the cathode. A current density of 400 mA/cm$^2$ is applied to the cell with the cell voltages in the range of 10-16 V at an electrolyte temperature of about 50° C. After 18 hours of anodic etching, the BD-UNCD® diamond slide is unloaded and rinsed with deionized water and inspected under SEM on the cross-section of the cleaved sample as shown in FIG. 4, which shows a number of FLD nanostructures 301 one of which is highlighted by a dash outline, mostly covered by a large number of barbs 303 two of which are highlighted by solid outlines. During this process, the surface area of the original BD-UNCD® diamond layer is increased by a factor of ten times or more, as characterized by the SEM images of FIGS. 4-6. In another cross-section SEM image shown in FIG. 5, there are a few shafts 302 (shown in FIG. 3) that are not covered by barbs. These shafts 302 can be identified by their long, continuous and bright forms in the SEM image. At locations very close to the edges of the sample, due to the edge effect in the etching process, the FLD nanostructures were over etched and fell down, which provides another angle to view these FLD nanostructures in under SEM in FIG. 6. The over etched, fallen FLD nanostructures are identified with reference character 301 in FIG. 6.

Example 2

Figure 8:
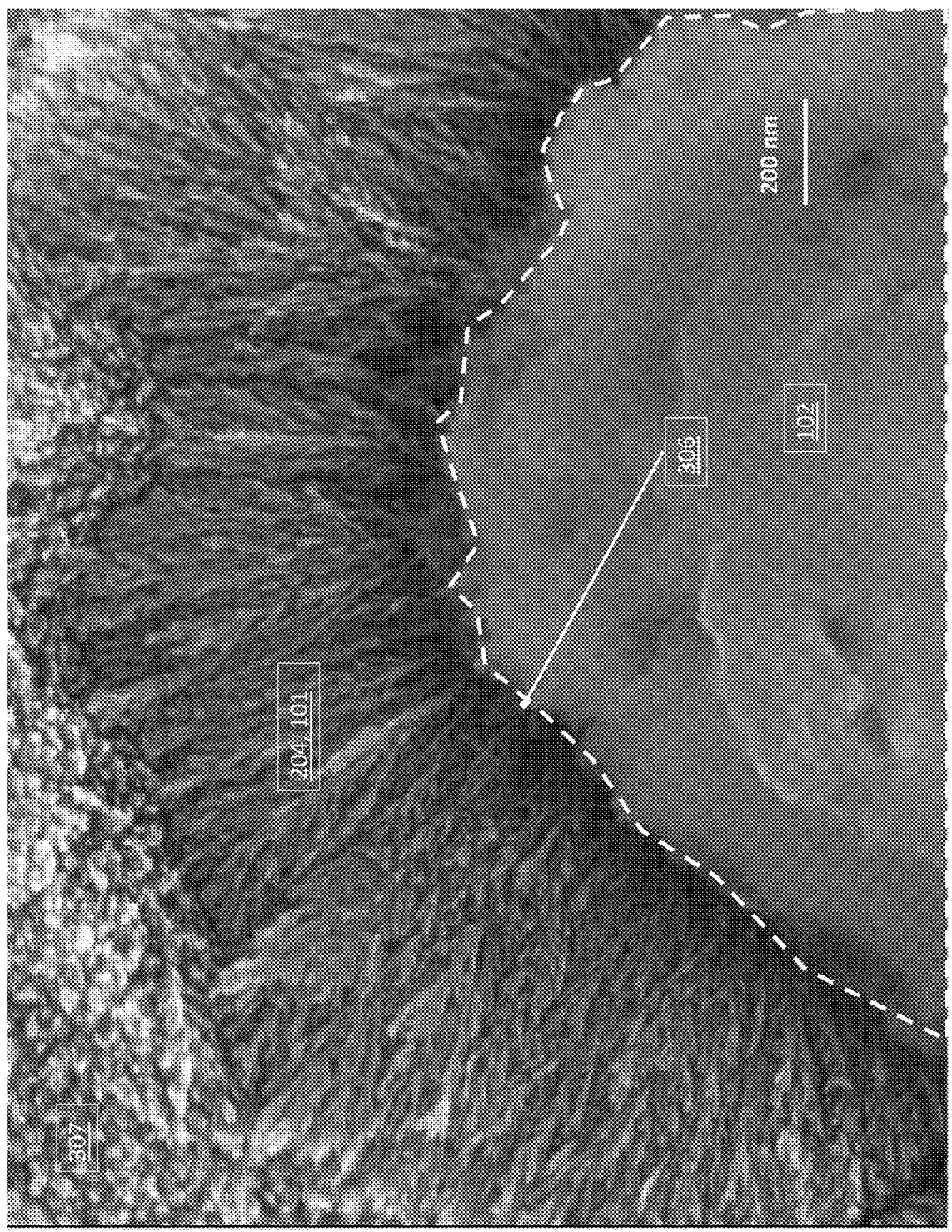
FIG. 8 is a cross-sectional SEM image of the sample from Example 2.

BD-UNCD® diamond is synthetized the same way as described above for Example 1 but on a Tantalum plate. The tantalum plate is roughened to increase substrate surface area before diamond coating and also to improve diamond adhesion on the substrate 102. In the electrochemical cell, similar to that in Example 1, the BD-UNCD®-Tantalum sample as the anode is coupled with a tungsten material as the cathode. A current density of 500 mA/cm$^2$ is applied to the cell with the cell voltages in the range of 14-18 V at an electrolyte temperature of about 30-40° C. After 8 hours of anodic etching, the BD-UNCD®-Tantalum anode is unloaded and rinsed with deionized water and inspected under SEM. The FLD nanostructures in this example look similar to those in Example 1, as shown with top view and side cross-sectional SEM images in FIG. 7 and FIG. 8 respectively. The substrate 102, feather-like diamond nanostructure layer 204 (formerly diamond film 101), and surface 307 of the feather-like diamond nanostructure layer 204 are identified with reference characters in FIGS. 7 and 8, wherein only the surface 307 is visible in FIG. 7. As shown with top view SEM image in FIG. 7, surface 307 has a puffy profile with a large number of pores and is fabricated on round hill-like profiles 306 from the roughened substrate 102 (shown in FIG. 8). The FLD nanostructures in layer 204 are formed in the BD-UNCD® layer 101 as shown in FIG. 8. The side cross-sectional SEM image in FIG. 8 shows the FLD nanostructures in the BD-UNCD® layer 204 between the tantalum substrate 102 and the surface 307.

Example 3

BD-UNCD® diamond is synthetized the same way as described above for Example 2. In the electrochemical cell, similar to that in Example 1, the BD-UNCD®-Tantalum sample as the anode is coupled with a stainless steel material as the cathode. A solution of 1M NaCl was introduced into an electrochemical cell. A current density of 2500 mA/cm$^2$ was applied to the cell with the cell voltages in the range of 10-18 V at an electrolyte temperature of about 40° C. After 250 hours of anodic etching, the BD-UNCD®-Niobium anode is unloaded and rinsed with deionized water and inspected under SEM. SEM images shows substantially the same FLD nanostructures as in Example 2. This example demonstrates that without organic acids, the disclosed electrochemical etching process can still lead to FLD nanostructures, but it takes considerable time even with a relatively high current density.

Example 4

Figure 9:
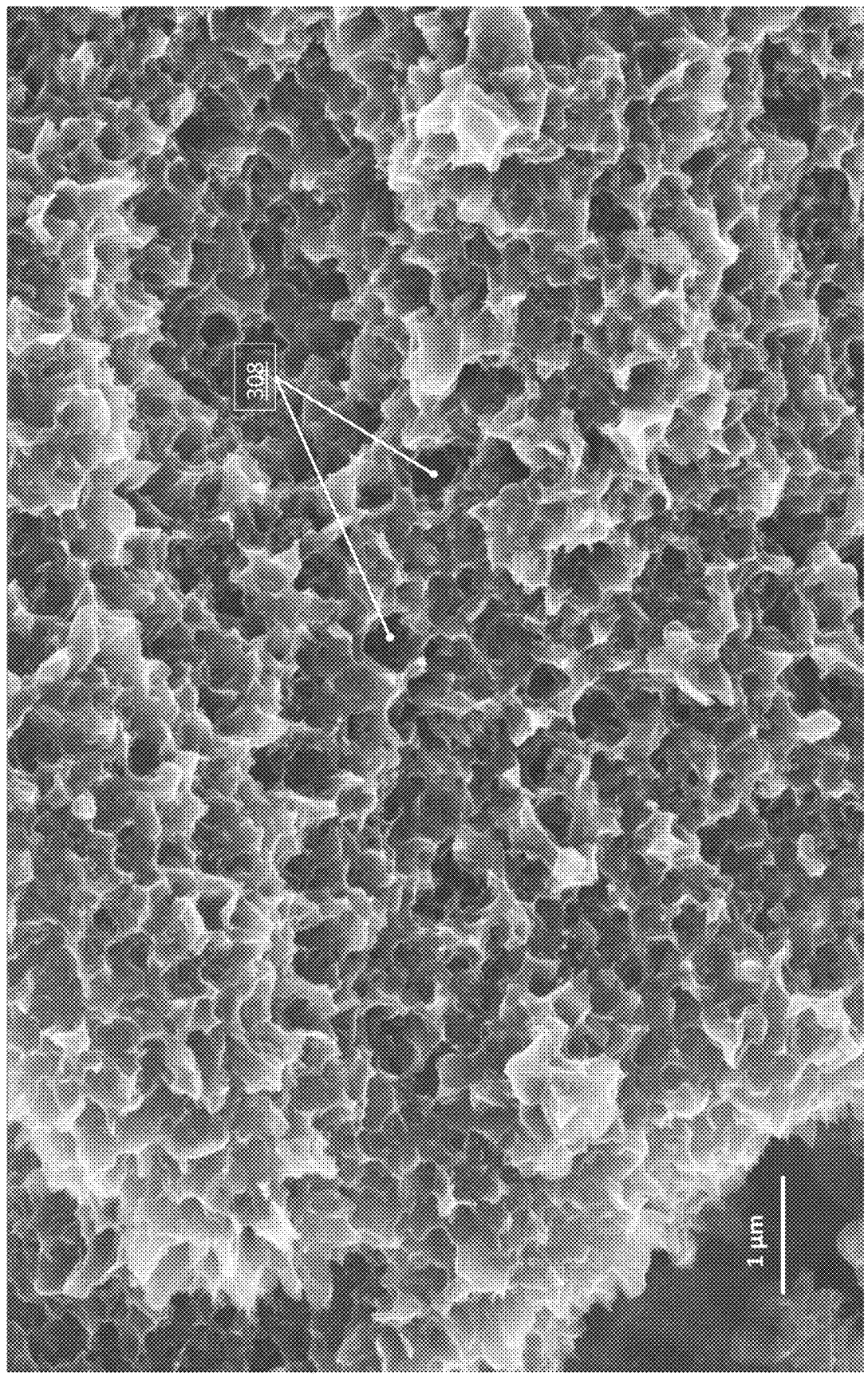
FIG. 9 is a top view SEM image of FLD nanostructures from Example 4.
Figure 10:
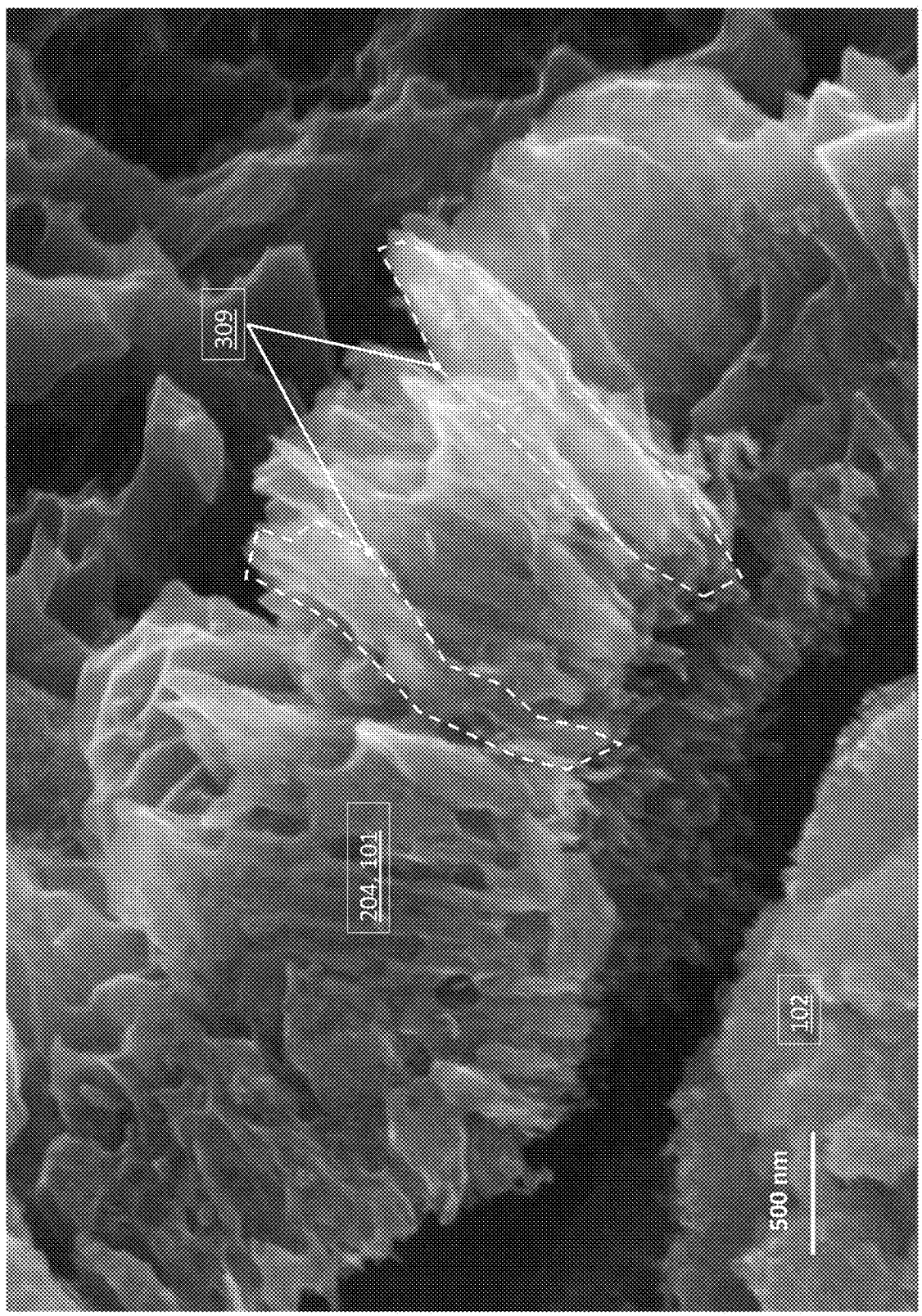
FIG. 10 is a cross-sectional SEM image of the sample from Example 4.

Boron doped nanocrystalline diamond (BD-NCD) is synthetized on a niobium plate by using hot filament CVD. The niobium plate is roughened to increase substrate surface area before diamond coating and also to improve diamond adhesion on the substrate. The BD-NCD has grain size of 30-80 nm, a thickness of 2 μm and a resistivity of 0.006 ohm•cm. The electrochemical cell is similar to that in Example 1. The BD-NCD-Niobium sample as the anode is coupled with a stainless steel material as the cathode. The anodic etching conditions are the same as in Example 2. After 12 hours of anodic etching, the BD-NCD-Niobium anode is unloaded and rinsed with deionized water and inspected under SEM, as shown in FIG. 9 and FIG. 10. The top view SEM image in FIG. 9 shows the FLD pores 308 are significantly greater than those in the examples above when BD-UNCD® films are used. The cross-sectional SEM image in FIG. 10 shows that many shafts 309 after etching, two of which are highlighted with dashed outlines, but there almost no barbs in the etched BD-NCD layer 204, resulting in a surface area enlargement less than in the examples above when BD-UNCD® layers are used. This example demonstrates more of an upper-limit of the grain size of the polycrystalline conductive diamond that can be used for fabricating FLD nanostructures. If a diamond layer with grain size larger than 100 nm is processed with the disclosed electrochemical fabrication method, there may be no FLD nanostructure produced. On the contrary, the diamond surface may be etched in a way that smooths out the surface, which has been conventionally employed for diamond polishing to achieve minimized surface area instead of enlarged surface area. During the process in this example, the surface area of the original BD-UNCD® diamond layer is still increased by a factor of two times or more, as characterized by the SEM images in FIGS. 9-10.

Example 5

BD-UNCD® diamond is synthetized the same way as described above for Example 1 but on a substrate of carbon foam which has a large initial surface area, e.g., Duocel® Reticulated Vitreous Carbon Foam available from ERG Aerospace Corp. of Oakland, Calif. In the electrochemical cell similar to that of Example 1, the BD-UNCD®-Carbon Foam sample as the anode is coupled with a stainless steel material as the cathode. A current density of 500 mA/cm$^2$ is applied to the cell with the cell voltages in the range of 25-30 V at an electrolyte temperature of about 30-40° C. After 8 hours of anodic etching, the BD-UNCD®-Carbon Foam anode is unloaded and rinsed with deionized water and inspected under SEM. The FLD nanostructures look similar to that of Example 1.

The methods and systems of the present disclosure, as described above and shown in the drawings, provide for diamond nanostructures with superior properties including increased specific surface area and ease of manufacture relative to traditional techniques. While the apparatus and methods of the subject disclosure have been shown and described with reference to preferred embodiments, those skilled in the art will readily appreciate that changes and/or modifications may be made thereto without departing from the scope of the subject disclosure.

What is claimed is:
1. A method of fabricating a diamond nanostructure, comprising:
   providing a substrate;
   depositing a layer of polycrystalline diamond including sp$^2$ and sp$^3$ carbon on to the substrate; and
   selectively removing sp$^2$ carbon and partially removing sp$^3$ carbon from the layer of polycrystalline diamond, thereby increasing surface area of the layer of polycrystalline diamond and forming a layer of featherlike diamond nanostructures, wherein the surface of the layer of polycrystalline diamond is made porous.

2. The method as recited in claim 1, wherein the layer of polycrystalline diamond is a conductive layer of at least one of boron doped nanocrystalline diamond (BD-NCD) or boron doped ultrananocrystalline diamond (BD-UNCD diamond).

3. The method as recited in claim 1, wherein the layer of polycrystalline diamond is conductive and is doped with dopants other than boron, including at least one of nitrogen and/or phosphorus.

4. The method as recited in claim 1, wherein the layer of polycrystalline diamond has an average grain size of 50 nm or smaller.

5. The method as recited in claim 1, wherein the layer of polycrystalline diamond has an average grain size of 100 nm or smaller.

6. The method as recited in claim 1, wherein the layer of polycrystalline diamond has an average grain size of 20 nm or smaller.

7. The method as recited in claim 1, wherein the $sp^2$ carbon is selectively removed and the $sp^3$ carbon is partially removed by an organic acid.

8. The method as recited in claim 7, wherein the organic acid contains acetic acid or oxalic acid.

9. The method as recited in claim 1, wherein an inorganic electrolyte is used separately or combined with the organic acid for removing $sp^2$ and $sp^3$ carbon.

10. The method as recited in claim 9, wherein the inorganic electrolyte includes NaCl or Sulfuric acid.

11. The method as recited in claim 1, wherein selectively removing $sp^2$ carbon includes selectively removing carbon by application of a positive voltage on the layer of polycrystalline diamond, whereby at least a portion of the carbon is etched off.

12. The method as recited in claim 11, wherein application of a positive voltage includes applying a current density of 50-2500 mA/cm$^2$ to a cell including electrolyte and the layer of polycrystalline diamond.

13. The method as recited in claim 1, wherein partially removing $sp^3$ carbon includes removing at least one whole diamond grain in the layer of polycrystalline diamond.

14. The method as recited in claim 1, wherein partially removing $sp^3$ carbon includes partially removing mass from at least one face of at least one diamond grain in the layer of polycrystalline diamond.

15. The method as recited in claim 1, wherein the substrate includes at least one of Si, Mo, Nb, Ta, Ti, W, conductive ceramics, and/or conductive carbides.

16. The method as recited in claim 1, further comprising adjusting $sp^2/sp^3$ ratio of the layer of polycrystalline diamond for ease of etching.

17. The method as recited in claim 1, further comprising adjusting facet orientation in the layer of polycrystalline diamond for ease of etching.

18. The method as recited in claim 1, wherein the $sp^2$ carbon is selectively removed and the $sp^3$ carbon is partially removed with one or more selective and/or preferential etching process including thermal oxidation, hot gas corrosion, reactive ion etching, plasma etching, laser ablation, ion beam etching, and/or a combination of these methods, wherein a substantial portion of diamond material remains.

19. The method as recited in claim 1, further comprising ceasing selective removal of $sp^2$ carbon and partial removal of $sp^3$ carbon once the layer of polycrystalline diamond is formed into the layer of feather-like diamond nanostructures and before any substantial number of the feather-like diamond nanostructures are removed.

20. The method as recited in claim 1, further comprising, after selective removal of $sp^2$ carbon and partial removal of $sp^a$ carbon from the layer of polycrystalline diamond, forming at least one of a capacitor, a supercapacitor, or a sensor electrode using the layer of polycrystalline diamond.

21. A method of fabricating a diamond nanostructure, comprising:
providing a substrate;
depositing a layer of polycrystalline diamond including $sp^2$ and $sp^3$ carbon on to the substrate; and
selectively removing $sp^2$ carbon and partially removing $sp^3$ carbon from the layer of polycrystalline diamond, thereby increasing surface area of the layer of polycrystalline diamond, wherein the surface of the layer of polycrystalline diamond is made porous and ceasing selective removal of $sp^2$ carbon and partial removal of $sp^3$ carbon are performed at a point during selective removal of $sp^2$ carbon and partial removal of $sp^3$ carbon when the surface area of the layer of polycrystalline diamond has increased to at least two times that of the layer of polycrystalline diamond prior to selective removal of carbon.

22. The method of claim 21 wherein the surface area has increased by a factor of 10 or more.

23. The method of claim 21 wherein the polycrystalline diamond layer after selective removing comprises feather-like diamond nanostructures.

\* \* \* \* \*